United States Patent [19]

Winstel

[11] 4,062,035
[45] Dec. 6, 1977

[54] LUMINESCENT DIODE

[75] Inventor: Guenter Winstel, Ottobrunn, Germany

[73] Assignee: Siemens Aktiengesellschaft, Berlin & Munich, Germany

[21] Appl. No.: 763,548

[22] Filed: Jan. 28, 1977

Related U.S. Application Data

[63] Continuation of Ser. No. 654,786, Feb. 3, 1976.

[30] Foreign Application Priority Data

Feb. 5, 1975   Germany .............................. 2504775

[51] Int. Cl.² .......................................... H01L 33/00
[52] U.S. Cl. ...................................... 357/17; 357/23
[58] Field of Search ............................. 357/17, 18, 23

[56] References Cited

U.S. PATENT DOCUMENTS

| | | | |
|---|---|---|---|
| 3,492,548 | 1/1970 | Goodman | 317/235 |
| 3,783,353 | 1/1974 | Parkove | 317/235 R |
| 3,806,774 | 4/1974 | Hartman | 317/235 R |
| 3,849,707 | 11/1974 | Braslan | 357/17 |
| 3,978,507 | 8/1976 | Fertin | 357/17 |

Primary Examiner—Martin H. Edlow
Attorney, Agent, or Firm—Hill, Gross, Simpson, Van Santen, Steadman, Chiara & Simpson

[57] ABSTRACT

A semiconductor luminescent device is disclosed of the MIS type which has a semiconductor body, a semiconductor monocrystalline insulating layer on one surface of the body and an electrode on the outer major surface of the insulating layer, which electrode is light transmissive. The crystal structure of the insulating layer is substantially the same as the crystal structure of the semiconductor body and has a spacing of energy bands which is greater than the light quanta which are emitted during a radiative recombination of charge carriers in the semiconductor body. The interval of the energy bands of the insulating layer is at least 2 kT greater than the interval of the energy bands of the semiconductor body. It is preferable that the crystal structure of the insulating layer have a deviation of its lattice interval of less than 1% from that of the semiconductor body.

13 Claims, 1 Drawing Figure

U.S. Patent      Dec. 6, 1977      4,062,035
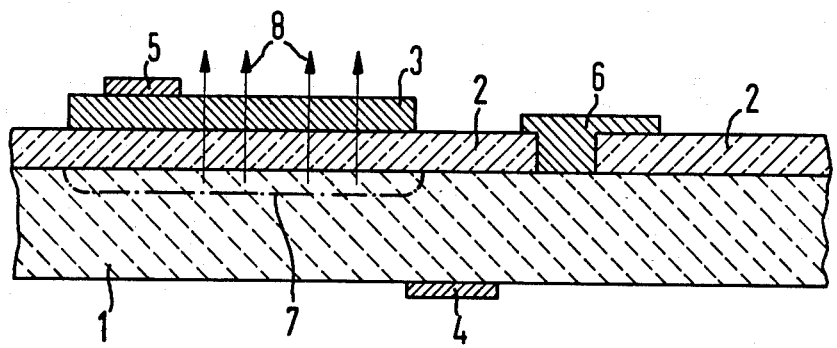

LUMINESCENT DIODE

This is a continuation, of application Ser. No. 654,786, filed Feb. 3, 1976.

BACKGROUND OF THE INVENTION

1. Field of the Invention

The field of the invention is luminescent diodes and particularly to luminescent diodes of the type which will give off a green light.

2. Description of the Prior Art

It is known in the prior art that semiconductor luminescent diodes may be constructed as an MIS structure in which an electro luminescense by the injection of charge carriers in a layer close to the surface of a semiconductor body. Such a construction is extremely suitable for construction in the integrated technique. These structures do, however, have the disadvantage that the surface of the semiconductor body, as a boundary, has the disadvantage in that the injected charge carriers frequently recombine non-radiatively on the surface. A construction of this type is described in "Solid State Electronics", 1974, Vol. 17, pp. 25–29.

SUMMARY OF THE INVENTION

It is an object of the present invention to increase the proportion of the light produced on the surface in a semiconductor luminescent device as hereinafter described. This end is obtained by providing a monocrystalline semiconductor insulating layer on the semiconductor body which has substantially the same crystal structure as the crystal structure of the semiconductor body and which exhibits a spacing between the energy bands which is greater than the energy of the light quanta which are emitted during the radiative recombination of charge carriers in the semiconductor body. A measurable component of the surface radiation can occur at surfaces which are subject to particularly little interference and which are formed, for example, by gaps.

In the present invention, it is provided that the light generation, i.e., the recombination of holes and electrons in the semiconductor body take place in a region which lies immediately under the insulating layer. This recombination can take place in the insulating layer which is formed on the surface of the semiconductor body. In such case, the semiconductor body acts as one electrode and an electrode on the outer surface of the insulating layer acts as the other electrode. This will occur because the insulating layer represents a monocrystalline continuation of the semiconductor body.

In addition to the electrode on the insulating layer hereinbefore referred to, the other electrode for the device may be disposed either on the under surface of the semiconductor body or may appear on the outer surface of the insulating layer as a metal contact which extends through an opening in the insulating layer into contact with a surface portion of the semiconductor body.

BRIEF DESCRIPTION OF THE DRAWING

The single FIGURE of the drawing diagrammatically illustrates a semiconductor luminescent device which embodies the novel teachings of the present invention.

DESCRIPTION OF THE PREFERRED EMBODIMENTS

As shown in the single FIGURE of the drawing, a semiconductor luminescent device of the MIS type is provided which includes a semiconductor monocrystalline body 1. An insulating layer 2 is formed on one major surface of the semiconductor body 1, the material of the insulating layer being selected, which in terms of its crystalline structure, its lattice constant, and thermal expansion coefficient, is particularly well adapted to the crystal properties of the semiconductor body. The surface of the semiconductor body then lies inside a crystal of layered construction and, therefore, is subject only to very slight disturbances. Here the layer which covers the semiconductor body simultaneously serves as a gate-insulator. With an arrangement of this type, disturbances on the surface of the semiconductor body are prevented.

An electrode 3 of metal covers a substantial portion of the outer surface of the insulating layer 2. As shown in the drawing, a circuit connection 5 is made to the electrode 3. A second circuit connection is made either through an electrode 4 which may be formed on the under surface of the semiconductor body or through an electrode 6 which extends through the insulating layer into direct contact with the semiconductor body.

Where the luminescent device is to emit green light, it is advantageous to employ GaAs as the semiconductor body and GaAlAs as the insulating layer. Another preferred form of the invention includes employing GaP for the basic crystal which forms the semiconductor body and GaAlP for the insulating layer. As mixed crystals composed of GaAlAs and GaAlP are particularly well matched to GaAs crystals and GaP crystals in terms of their lattice structure and their thermal and optical properties. With a construction of this type particularly good values can be achieved for the light yield of these diodes.

The insulating layer is preferably epitaxially deposited onto the semiconductor body and preferably has a thickness of between approximately 50 nm and 1,000 nm. In this case, the insulating layer is sufficiently thin to enable charge carriers to be injected out of the electrode arranged upon it and into the semiconductor body lying beneath the insulating layer by the tunnel effect. Furthermore, the emission then takes place in a layer which lies closer than one wave length of the emitted light below the surface. The insulating layer acts as a type of hardening layer which leads to a reduction in the reflection at the semiconductor-insulator interface or the light radiation emerging from the semiconductor material. The electrode 3 on the insulating layer 2 is permeable to the light emitted in the semiconductor body. This can occur where a particularly thin layer of metal or a layer of tin oxide or indium oxide is employed for the electrode. The light in the semiconductor body can thus pass to the outside without requiring the electrode to exhibit any specific geometry such as having windows.

Details of the construction of the preferred embodiment of the present invention illustrated in the drawing will now be described. To a basic semiconductor crystal 1 consisting, for example, of gallium arsenide or gallium phosphide, is epitaxially applied the layer 2 consisting of GaAlAs or GaAlP. This application can take place by means of gas-epitaxy, melt-epitaxy or by ion- or molecular ray epitaxy. The thickness of the layer 2 is between 50 nm and 1,000 nm. This layer is rendered highly ohmic either by suitably doping during growth, e.g., by Fe doping, or by doping following the growth process by diffusion or ion implantation of oxygen or chromium. This layer can also be rendered highly ohmic by proton bombardment. It then possesses a specific resistance of ore than approximately $10^3$ ohm-cm Arranged on this insulating layer 2 is the electrode 3. This electrode is formed of a thin metal layer or of a layer of $SnO_2$ or $In_2O_3$.

Light produced in the zone 7 which is the region illustrated as being immediately below the interface of the semiconductor body 1 and the insulating layer 2 as shown in the drawing, can emerge from the semiconductor body in the direction indicated by the arrows 8.

With the layer 2 formed of a semiconductor material as described above, the layer 2 represents a monocrystalline continuation of the semiconductor body 1. Hence, the boundary surface between the semiconductor body and the layer 2, from a physical standpoint, practically disappears, and the region 7 has, so to speak, no exterior surface.

In order to achieve that the above named recombination of the charge carriers occurs in region 7 (and not in layer 2), it is necessary that the interval of the energy bands of the layer 2 material be at least $2kT$ larger than that of the body 1 (where $k$ = Boltzmann-constant; $T$ = absolute temperature). With a band interval greater than at least $2kT$, the charge carriers located in region 7 of the semiconductor body are hindered in crossing over from region 7 into layer 2 and, in consequence, recombine with one another in region 7. The quantity $2kT$ corresponds to the statistical energy distribution of the charge carriers in the semiconductor body and this is valid for all temperatures (since the temperature value is contained in the expression).

In order to make the boundary conditions between the semiconductor body 1 and the layer 2 into a practically disappearing surface, the layer 2 must have nearly the same lattice interval, and more particularly, must be a deviation of the lattice constants of less than 1% from those in the semiconductor body 1.

In the luminescent device described above, it should be noted that the interval of the energy bands of the layer (2) material be at least $2kT$ greater than the interval of the energy bands of the semiconductor body (1) material.

It will be apparent to those skilled in the art that many modifications and variations may be effected without departing from the spirit and scope of the novel concepts of the present invention.

I claim as my invention:

1. A semiconductor luminescent diode comprising a semiconductor body, a layer of insulating material on this semiconductor body, and a layer of conductive material arranged upon said insulating layer, the layer of insulating material being monocrystalline having the crystal structure of the semiconductor body, and having a spacing of energy bands which is greater than the energy of the light quanta which are emitted during a radiative recombination of charge carriers in the semiconductor body.

2. A luminescent diode as claimed in claim 1, in which the layer of insulating material possesses a thickness of between approximately 50 nm and 1,000 nm.

3. A luminescent diode as claimed in claim 1, in which said layer of insulating material is epitaxially formed on said semiconductor body.

4. A luminescent diode as claimed in claim 1, in which said conductive layer is itself light-transmissive.

5. A luminescent diode as claimed in claim 1, in which said semiconductor body is GaAs, and said insulating layer is a GaAlAs mixed crystal.

6. A luminescent diode as claimed in claim 1, in which said semiconductor body is GaP, and said insulating layer is a GaAlP mixed crystal.

7. A semiconductor luminescent diode comprising a semiconductor body, a layer of insulating material on said semiconductor body, and a layer of conductive material arranged upon said insulating layer, the layer of insulating material being monocrystalline having the crystal structure of the semiconductor body, the band spacing of the energy bands of said insulating layer being at least $2KT$ larger than the band spacing of said semiconductor body.

8. A semiconductor luminescent diode comprising a semiconductor body, a layer of insulating material interfaced with one surface of said semiconductor body, and a layer of conductive material formed on the outer surface of said insulating layer and interfaced therewith, said insulating layer having substantially the same lattice interval as the lattice interval of said semiconductor body and deviating therefrom by less than 1%.

9. A luminescent diode according to claim 7, in which said insulating layer has a thickness of between approximately 50 nm and 1,000 nm.

10. A luminescent diode according to claim 8, in which said insulating layer has a thickness between approximately 50 nm and 1,000 nm.

11. A semiconductor luminescent diode comprising a semiconductor body, a layer of insulating material interfaced with one surface of said semiconductor body, and a layer of conductive material formed on the outer surface of said insulating layer and interfaced therewith, said insulating layer having substantially the same lattice interval as the lattice interval of said semiconductor body and deviating therefrom by less than 1%, said layer of insulating material being monocrystalline having the crystal structure of the semiconductor body, the band spacing of the energy bands of said insulating layer being at least $2kT$ larger than the band spacing of said semiconductor body.

12. A luminescent diode according to claim 11, in which said insulating layer has a thickness of between approximately 50 nm and 1,000 nm.

13. A luminescent diode according to claim 11, in which said layer of insulating material is epitaxially formed on said semiconductor body.

* * * * *